United States Patent [19]

Luft et al.

[11] 4,154,998
[45] May 15, 1979

[54] SOLAR ARRAY FABRICATION METHOD AND APPARATUS UTILIZING INDUCTION HEATING

[75] Inventors: Werner Luft, Palos Verdes Peninsula; Robert E. Kennedy, Torrance; Hans G. Mesch, Manhattan Beach, all of Calif.

[73] Assignee: TRW Inc., Redondo Beach, Calif.

[21] Appl. No.: 814,949

[22] Filed: Jul. 12, 1977

[51] Int. Cl.² ............... H05B 5/08; B25B 11/00; H01L 31/18

[52] U.S. Cl. ............... 219/10.49 R; 29/572; 136/89 P; 219/10.53; 219/10.69; 269/21; 269/321 WE

[58] Field of Search ............ 219/10.49, 10.53, 10.69, 219/9.5; 269/21, 321 WE; 136/89 P, 89 H; 29/572, 623.4, 577, 627, 628

[56] References Cited

U.S. PATENT DOCUMENTS

| 3,520,053 | 7/1970 | Hinton et al. | 219/10.53 |
| 3,694,609 | 9/1972 | Kennedy | 219/10.53 |
| 3,700,226 | 10/1972 | Mrugala | 269/321 WE |
| 3,786,222 | 1/1974 | Harnden et al. | 219/10.49 |
| 3,949,295 | 4/1976 | Moorshead | 269/21 |
| 4,062,102 | 12/1977 | Lawrence et al. | 29/572 |

Primary Examiner—Bruce A. Reynolds
Attorney, Agent, or Firm—Donald R. Nyhagen; John J. Connors

[57] ABSTRACT

A solar array having solar cells mounted on a substrate and electrically joined by rear connector elements on the substrate and front connector elements secured between the cells to the substrate is fabricated by placing the array components in assembled relation and utilizing induction heating to heat to their fusion temperatures a thermoplastic adhesive layer on the substrate and contacting fusible cladding on the solar cells and the connector elements while retaining the components in firm contact to effect adhesive bonding of the solar cells and front connector elements to the substrate and metallic bonding of the solar cells and connector elements to one another.

3 Claims, 7 Drawing Figures

4,154,998

SOLAR ARRAY FABRICATION METHOD AND APPARATUS UTILIZING INDUCTION HEATING

The invention herein described was made in the course of or under a contract or subcontract thereunder, (or grant), with the Department of the Navy.

RELATED APPLICATION

Copending application Ser. No. 814,950, filed July 12, 1977, and entitled, "Solar Array Fabrication Method and Apparatus" assigned to the same assignee as the instant application.

BACKGROUND OF THE INVENTION

1. Field

This invention relates generally to solar arrays and more particularly to a novel method of and apparatus for fabricating solar arrays of the kind having solar cells mounted on a substrate, such as a flexible plastic substrate, utilizing radio frequency bonding of the array components to one another.

2. Prior Art

Solar arrays have been widely used on spacecraft for electrical power generation and are presently being developed for terrestrial use also. Fabrication of solar arrays according to conventional fabrication techniques is tedious and time consuming. This is due to extremely large number of solar cells required for most applications, particularly terrestrial applications, which must be securely mounted on the array substrate or other solar cell support and securely electrically joined in the desired electrical circuit configuration.

SUMMARY OF THE INVENTION

This invention provides an improved method and apparatus for fabricating a solar array of the kind whose components include solar cells mounted on a substrate, preferably a flexible substrate such as a plastic sheet, and electrically joined in the desired electrical configuration by front and rear metallic cell connectors.

As employed in this invention, the substrate is provided on its normally front surface with a thermoplastic adhesive layer and with a pattern of electrically conductive elements which may be in the form of a printed circuit and constitute the rear solar cell connector elements. The front solar cell connector elements are separate elements and, in the described embodiment, comprise connector strips. These front and rear connector elements are coated with a fusible cladding, such as solder. Each solar cell has front and rear fusible cladding regions which form the cell terminals.

A solar array is fabricated by placing the array components in assembled relation wherein the front cell connector elements extend across and contact the front cladding regions or terminals of selected solar cells. The substrate is located at the rear side of the cells with its rear cell connector elements contacting the rear cladding regions or terminals of selected solar cells.

The array components are simultaneously joined by inductively heating metallic elements, referred to herein as susceptors, disposed in heat transfer relation to the adhesive layer on the substrate and the cladding on the solar cells and cell connector elements so as to heat the adhesive and cladding to their fusion temperatures while retaining the components in form contact. The solar cells and their front connector elements are thus adhesively bonded to the substrate and the front and rear connector elements are electrically joined to the front and rear terminals of the cells.

Another aspect of the invention is concerned with apparatus for use in practicing the above solar array fabrication procedure. This apparatus comprises a fixture including a platen having solar cell location recesses entering its normally upper surface, an induction heating unit and metallic susceptors.

In use of this apparatus, the front cell connector elements are first placed on the fixture platen. Thereafter, the solar cells are placed in the recesses, front side down, so that the front cell cladding regions or terminals of the cells contact the underlying front connector elements. Finally, the substrate is placed over the cells, front side down, so that the rear cell connector elements on the substrate contact the rear cell cladding regions or terminals. The metallic susceptors are placed in heat transfer relation to the portions of the assembled array components to be adhesively and electrically joined.

The assembled array components and susceptors are then pressed together and the susceptors are heated in the induction heating unit to effect adhesive and metallic bonding of the components. According to a feature of the invention, the array components are pressed together by atmospheric pressure.

DESCRIPTION OF THE PREFERRED EMBODIMENTS

Figure 1:
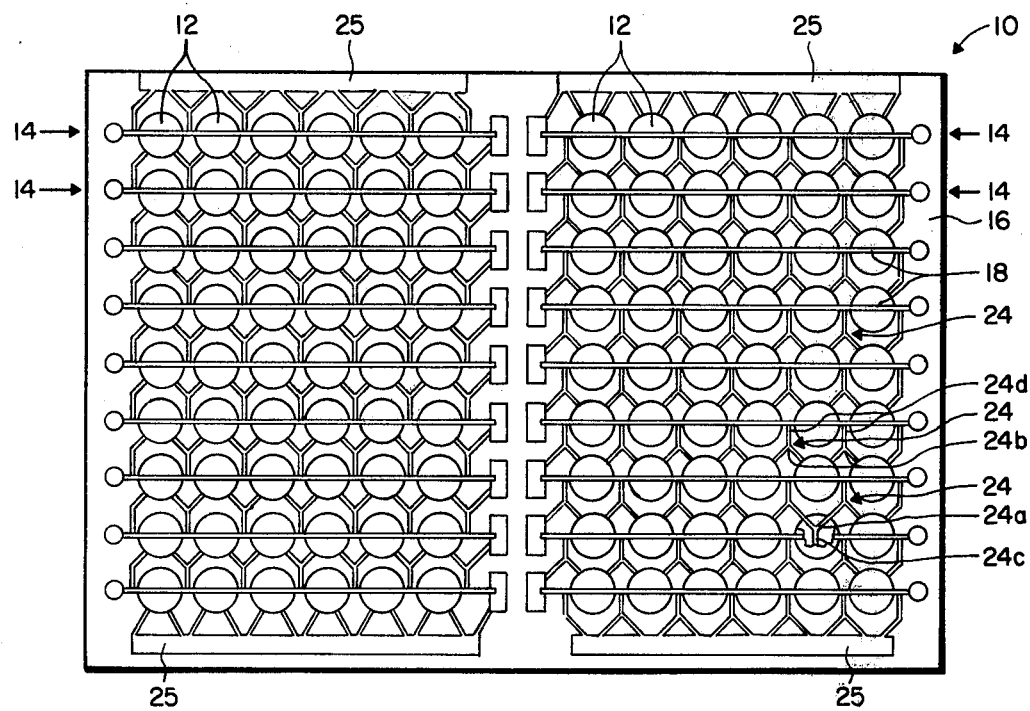
FIG. 1 is a view of the front side of a solar array fabricated in accordance with this invention.
Figure 5:
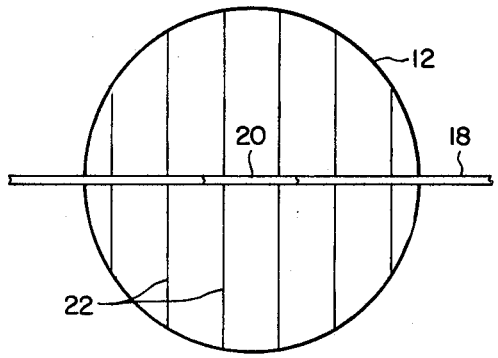
FIG. 5 is an enlarged face view of one solar cell and its front connector element.
Figure 6:
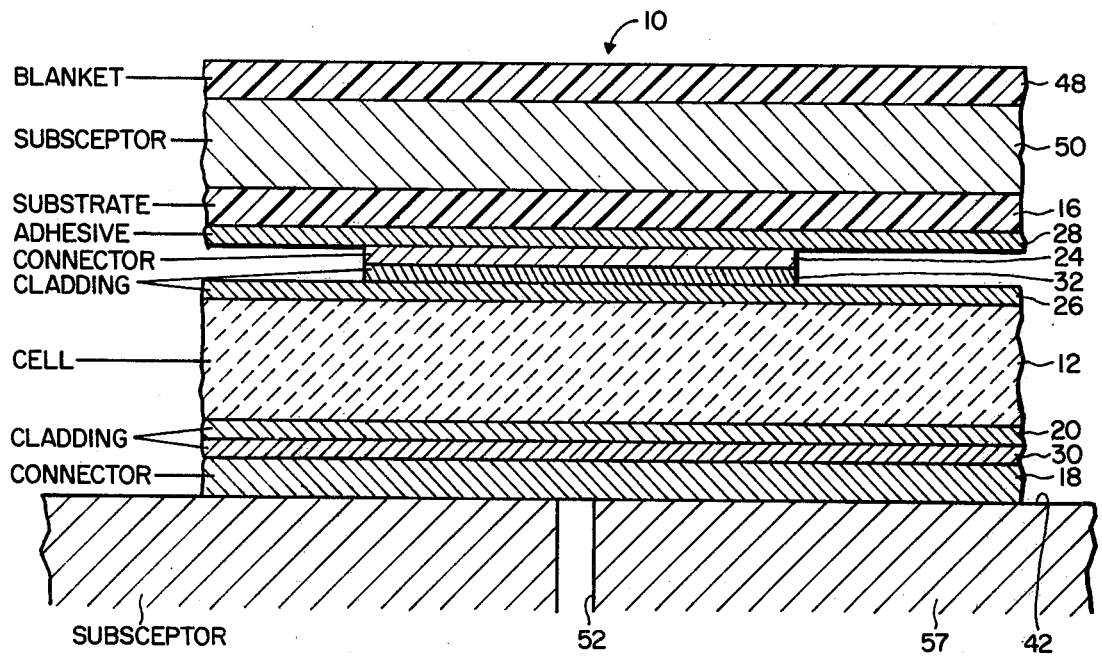
FIG. 6 is a further enlargement of the area encircled by the arrow 6—6 in FIG. 4.

Reference is made first to FIG. 1 illustrating a finished solar array 10 fabricated by the present invention. This solar array has solar cells 12 mounted in rows 14 on a substrate 16 which, in this instance, is a flexible substrate, such as a plastic sheet (KAPTON TM OR THE LIKE). The front surfaces of the cells which face the viewer in FIG. 1 are their light sensitive faces. Extending across these front cell faces are metallic front cell connector elements 18. The particular cell connector elements shown are connector strips which extend along the centerlines of the cell rows 14 and diametrically across the front faces of the cells 12, as shown in FIG. 5. The front region of each cell 12 underlying its connector element or strip 18 forms its front terminal 20 to which the strip is mechanically and electrically joined in the manner explained below. Extending outwardly across the front face of each cell from its front terminal 20 are parallel current conductors 22.

Figure 3:
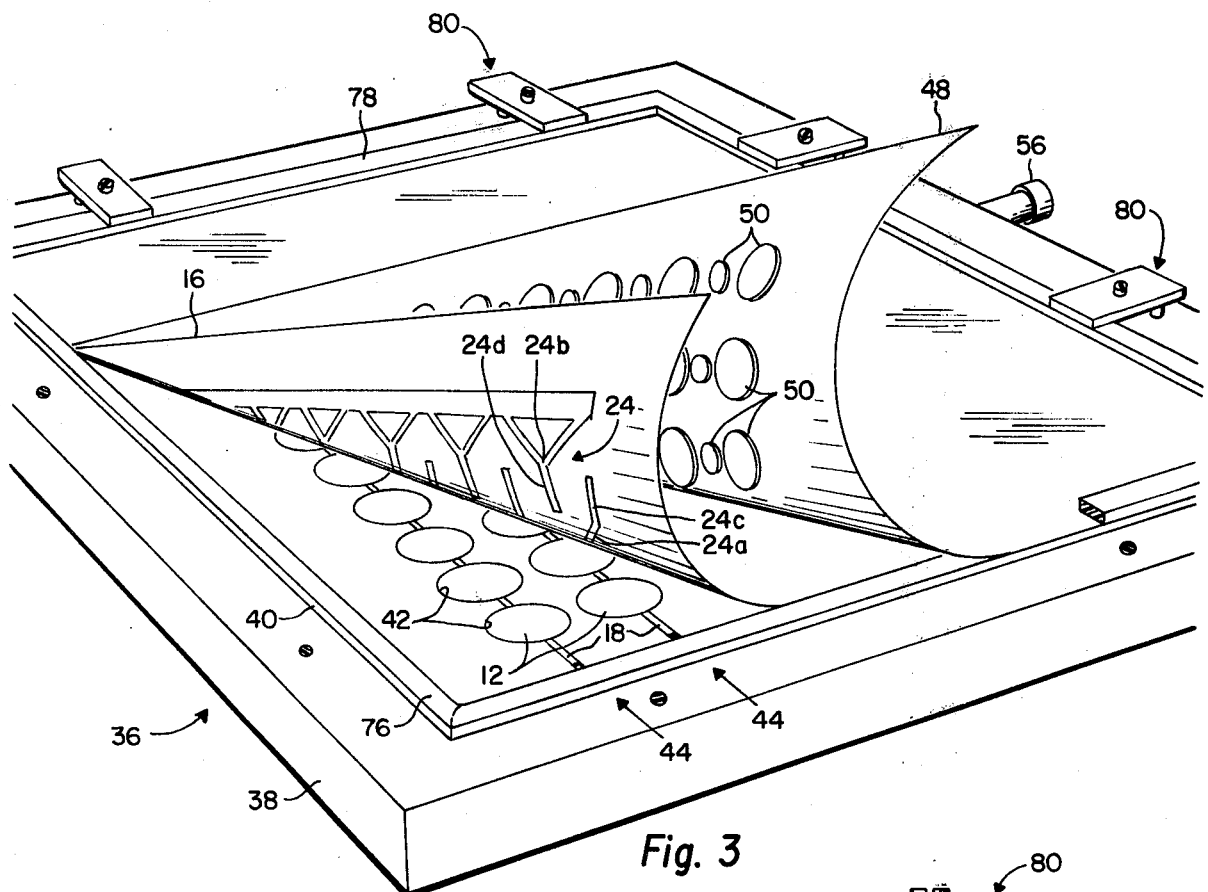
FIG. 3 is a perspective view of the fixture with the solar array components assembled thereon.

On the front surface of the substrate 16 are metallic rear cell connector elements 24. These rear connector elements are formed directly on the substrate, as by a printed circuit technique, and extend under and contact rear terminals 26 on the cells 12 in each cell row 14 and the connector strip 18 of an adjacent cell row. In this regard, it will be seen in FIGS. 1 and 3 that each rear conductor element 24 extends between two adjacent cell rows 14 and has a generally zig-zag shape including alternate apex portions 24a, 24b and terminal portions 24c, 24d extending from these apex portions. The apex portions 24a and terminal portions 24c of each connector element underlie and contact the rear terminals 26 of the cells 12 in one adjacent cell row. The connector apex portions 24b are located between the cell rows, and their terminal portions 24d underlie and contact the connector strip 18 for the adjacent cell row. The front connector strips 18, cells 12, and rear connectors 24 are electrically and mechanically joined and the solar cells and front cell connector strips are adhesively bonded to the substrate 16, all in the manner explained below.

It will now be understood that in the finished solar array 10, the front cell connector elements or strips 18 join the cells 12 in their respective cell rows 14 in electrical parallel, such that each cell row forms a parallel cell string. The rear cell connector elements 24 join the several parallel cell strings in electrical series. The substrate connector elements 24 also provide terminals 25 for the array.

The primary contribution of the present invention is a method of and apparatus for fabricating the solar array 10. According to the invention, the front side of the substrate 16 is provided with a thermoplastic adhesive layer 28 for adhesively bonding the solar cells 12 and front cell connector strips 18 to the substrate. This adhesive layer may cover the front side of the substrate except for its rear cell connector elements 24 or, alternatively, it may cover only those portions of the substrate occupied by the solar cells and front cell connector strips. The front and rear sides of the solar cells have regions which are coated with fusible metal cladding, such as silver solder, and form the front and rear cell terminals 20, 26. For this reason, the cell terminals are hereinafter referred to in places as front and rear cladding regions of the cells. The front cell connector strips 18 and rear cell connector elements 24 are coated with fusible metal cladding 30, 32, respectively, such as silver solder.

According to the present method of fabricating the solar array 10, the array components, that is the solar cells 12, substrate 16 with its rear cell connector elements 24, and the front cell connector strips 18, are first placed in assembled relation. In this assembled relation, the front connector strips 18 extend across the front sides of their respective solar cells 12 in contact with the front terminals or cladding regions 20 of the cells. The substrate 16 is disposed at the rear side of the cells 12 with the rear cell connector elements 24 contacting the rear terminals or cladding 26 on the cells in each cell row 14 and the rear sides of the connector strips 18 in the adjacent cell rows, in the regions between adjacent cells.

After completion of this assembly procedure, the array components are subjected to a pressure or force which retains the components in firm contact with one another, and simultaneously the fusible cladding 20, 26 on the solar cells 12, the fusible cladding 30, 32 on the front cell connector strips 18 and rear cell connector elements 24, and the substrate adhesive layer 28 are heated to their fusion temperatures by inductively heating metallic susceptors 50, 57 in contact with the assembled array components in a manner such that the solar cells 12 and connector strips 18 are adhesively bonded to the substrate 16 and the connector strips, cells and the rear connector elements 24 are electrically joined.

According to another of its aspects, the invention provides apparatus 34 for practicing the above described array fabrication method. Apparatus 34 includes an assembly and holding fixture 36 on which the array components are assembled and heated, as described above, and an induction heating unit 37.

Referring particularly to FIGS. 1-4, the fixture 36 comprises a hollow platten 38 having a flat plate 40 secured to its upper side. Entering the upper surface at this plate are a multiplicity of shallow solar-cell-locating cavities or recesses 42. Recesses 42 are sized to receive the solar cells 12 with a relatively close fit and are arranged in the pattern to which the cells in the finished solar array are to conform. In this instance, the cell recesses are arranged in rows 44 like the solar cells 12 in the finished array 10. Extending along the centerline of each recess row 44 is a shallow channel 46 for receiving a front cell connector strip 18.

The depth of the recesses 42 approximates or is slightly less than the thickness of the solar cells 12. The depth of the channels 46 approximates or is slightly less than the thickness of the connector strips 18.

Figure 4:
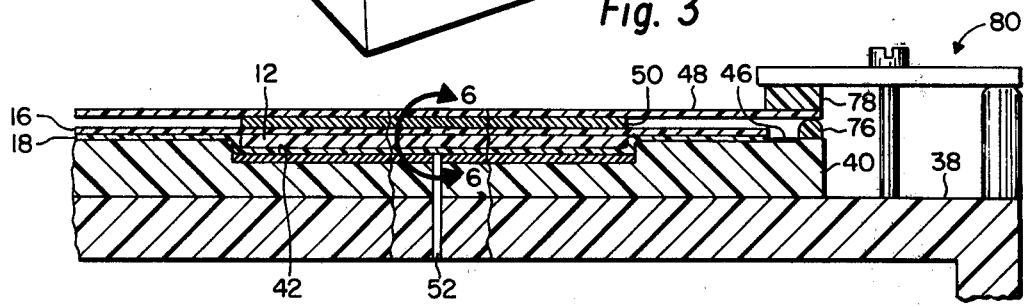
FIG. 4 is an enlarged fragmentary through the fixture and the solar array components thereon.

In use of the assembly fixture 36, the solar array components are assembled for bonding by first placing the front cell connector strips 18 in the fixture channels 46. Those strips extend across the cell locating recesses 42. Thereafter, the solar cells 12 are placed, front side down, in these recesses, thereby deforming the connector strips 18 into the recesses, as shown in FIG. 4. When thus placed in the fixture, each connector strip contacts the front terminals or fusible cladding regions 20 of the respective solar cells.

The substrate 16 with its adhesive layer 28 and rear cell connector elements 24 is then placed on the assembly fixture 36, front side down, over the solar cells 12 and connector strips 18 now on the fixture. The substrate is located so that its rear cell connector elements 24 contact the connector strips and the rear terminals or fusible cladding regions 26 on the cells in the manner described earlier and shown in FIG. 1. Means (not shown) may be provided for thus locating the substrate relative to the fixture.

Figure 2:
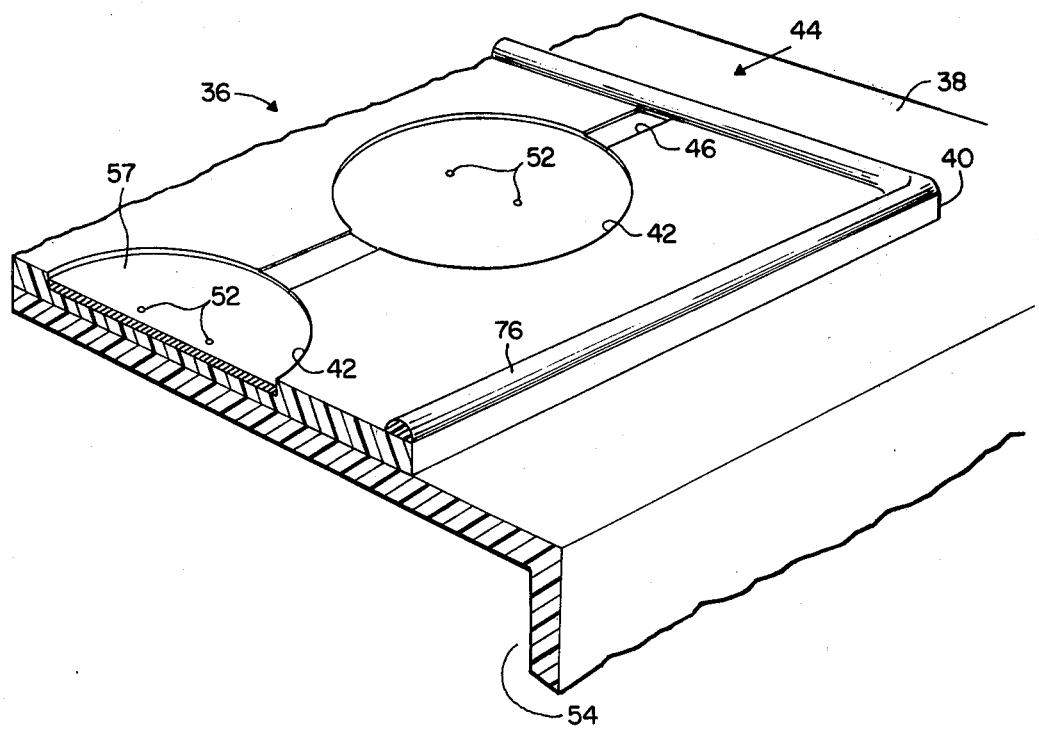
FIG. 2 is an enlarged fragmentary perspective view of an array assembly and holding fixture according to the invention for use in fabricating the array of FIG. 1.
Figure 7:
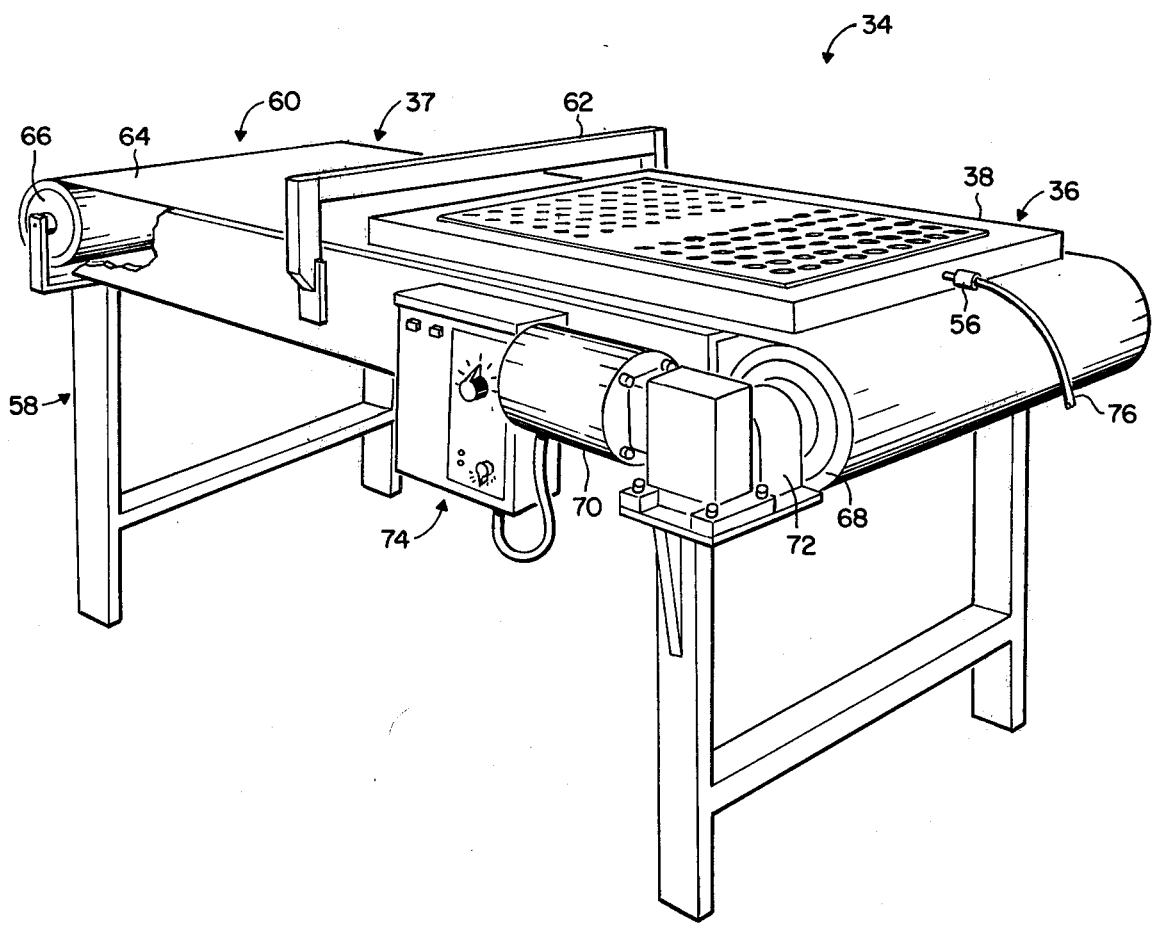
FIG. 7 is a respective view of induction heating apparatus for use in the invention.

The array components thus assembled on the fixture are then pressed into firm contact and heated to effect bonding of the components to one another in the manner explained earlier. According to this invention, atmospheric pressure is utilized to press the assembled array components into firm contact and the induction heating unit 37 of FIG. 7 is utilized for bonding the array components to one another. To these ends, there is placed over the assembled array components an air impervious vacuum blanket 48, such as a plastic sheet, mounting on its underside metallic discs or susceptors 50. This blanket is clamped along its edge to the platen 38, as described later. Air passages 52 communicate the interior chamber 54 in the hollow platen 38 to the solar cell locating recesses 42. The platen has a fitting 56 through which the chamber 54 and thereby the recesses 42 may be evacuated. Air is thereby evacuated from the underside of substrate 16 and blanket 48 to effect pressing of the array components into firm contact by the atmospheric pressure on the blanket. Additional metallic susceptors 57 are placed in the bottom of the solar cell recesses 42 in the fixture 36 as shown in FIGS. 2 and 7. Plate 40 is constructed of RTV silicone rubber or the like to avoid bonding between the array and the fixture.

Referring to FIG. 7, the induction heating unit 37 comprises a frame 58 supporting conveyor means 60 for transporting past an induction heating bar 62 on the frame 58, the solar array assembly fixture 36 with the array components and vacuum blanket 48 assembled thereon and the fixture platen 38 evacuated to retain the array components in firm contact with one another. The heating bar 62 contains an induction heating coil (not shown) which is energized from a suitable high frequency source.

In the particular heating unit shown, the conveyor means 60 comprises an endless conveyor belt 64 which is trained about rollers or drums 66, 68 rotatably mounted on the ends of the frame 58. Conveyor belt 64 is supported at its underside between the drums 66, 68 by a plate or the like (not shown) on the frame 58. Drum 68 is driven by a motor 70 through a right angle drum 72. Mounted on the frame is a control panel 74 containing controls for independently adjusting the induction field of the induction heating bar 62 and the speed of the conveyor 60.

In use of the induction heating unit 37, the array assembly fixture 36 with the array components and vacuum blanket 48 assembled thereon is placed on the conveyor 60 and connected by a hose 76 to a vacuum source for retaining the components in firm contact. The conveyor is then operated to transport the fixture at a controlled speed past the induction heater bar 62 while the latter is energized at a selected power level and frequency.

The high frequency field generated by the induction heater bar 62 inductively heats the susceptors 50, 57 which, in turn, heat to their fusion temperatures the substrate adhesive 28 and the fusible cladding 20, 26, 30, 32 on the solar cells 12, front connector strips 18 and rear connector elements 24. The cells and connector strips are thereby adhesively bonded to the substrate, and the cells, connector strips, and connector elements are electrically joined.

To this end, susceptors 50 and 57 are located opposite the solar cells 12 and the points of contact of rear cell connector elements 24, and front connector strips 18 to achieve effective metallic bonding of the connectors and cells to one another and adhesive bonding of the cells and connectors to the substrate.

The particular solar array 10 shown includes only solar cells, connector elements, and a substrate. The array, however, may embody other elements, such as by-pass diodes, reinforcing strips for the substrate perimeter, and the like, which may be assembled and bonded in the manner explained. The fixture plate 40 is constructed of a material, such as RTV silicone, to avoid bonding between the array components and the fixture.

In order to achieve effective evacuation of the underside of the vacuum blanket 48 and thereby firm retention of the assembled solar array components in firm contact during induction heating, the plate 40 is provided about its edge with a sealing rib 76 of somewhat resilient material, such as a suitable rubber or plastic, on which seats the outer edge of the blanket 48. A clamp frame 78 overlying the blanket edge and screw clamps 80 engaging the frame hold the blanket in sealing contact with the rib 76. It will be understood that the fixture 36, including its platen 38, plate 40, frame 78 and clamps 80 are constructed of suitable non-metallic materials, i.e. plastics.

If desirable or necessary, additional magnetic susceptors may be placed on the assembly fixture 36 and/or vacuum blanket 48 to provide additional heating where required. In addition, the field strength of the induction heater bar 62 and the speed of conveyor 60 are adjustable to achieve proper bonding of the array components.

The present invention has a number of advantages which may be stated as follows:
(1) The assembly is fast. The assembly bonding and soldering of a 6 square foot area is accomplished in 1-2 minutes time.
(2) The heating and cooling of each solar cell is done rapidly (in the order of seconds) minimizing the time during which the solder is in molten form. This minimizes cell degradation during assembly.
(3) The components are accurately registered (located relative to each other). This minimizes losses in electrical output from the solar cells. All circuit paths can be made narrow, minimizing mass.
(4) The process is inexpensive in labor. By automating the cell loading into the assembly fixture, the labor cost can be further reduced.
(5) The temperature of the components which is reached in the process can be carefully controlled by proper adjustment of the belt speed.
(6) By proper sizing and distribution of magnetic susceptors molded into the fixture or attached to the vacuum bag, desired variable temperatures can be achieved in different components and at different places over the total unit.

What is claimed is:
1. An assembly fixture for use with an induction heater to fabricate a solar array comprising:
a platen having a normally upper generally planar surface and parallel rows of solar cell locating recesses entering said surface,
a flexible vacuum blanket adapted to be positioned over said platen with the perimeter of said blanket in sealing contact with said platen and with the normally underside of said blanket facing said platen,
metallic susceptors fixed to the underside of said blanket in positions such that said susceptors are located opposite said recesses when said blanket is placed over said platen,
said platen being adapted to receive solar cells within said recesses front side first and to receive over said platen between the latter and said vacuum blanket a thin flexible substrate sheet with thermoplastic adhesive opposite and contacting the rear side of each solar cell contained in said platen recesses, and
said platen being movable past induction heater means to inductively heat said susceptors and further comprising means for evacuating the space between said platen and vacuum blanket to effect firm retention by atmospheric pressure of said substrate in contact with said solar cells and said susceptors in contact with said substrate opposite said solar cells during said induction heating of said susceptors in such a way as to bond said solar cells to said substrate.
2. An assembly fixture for use with an induction heater to fabricate a solar array comprising:

a platen having a normally upper generally planar surface, parallel rows of solar cell locating recesses entering said surface, and connector strip locating channels entering said surface between the adjacent recesses and along the center-lines of said rows and opening endwise to the adjacent recesses, a flexible vacuum blanket adapted to be positioned over said platen with the perimeter of said blanket in sealing contact with said platen and with the normally underside of said blanket facing said platen, metallic susceptors fixed to the underside of said blanket in positions such that said susceptors are located opposite said recesses when said blanket is placed over said platen, metallic susceptors positioned within the bottoms of said recesses, said platen being adapted to receive within said channels front metallic connector strips extending across and contacting the susceptors within said recesses, and to receive within said recesses front side first and over the respective connector strips solar cells having front terminal portions contacting the underlying connector strips, and to receive over said platen between the latter and said vacuum blanket a thin flexible substrate sheet with thermoplastic adhesive contacting the rear side of each solar cell contained in said platen recesses and connector strips extending between the adjacent cell rows and contacting rear terminals on the solar cells in one row and the connector strip between the cells in the adjacent row, the contacting portions of said cell terminal and connector strips having fusible metal surfaces, additional metallic susceptors on said vacuum blanket for contacting said substrate opposite the contacting portions of said connector strips, said platen being movable past induction heater means to inductively heat said susceptors and further comprising means for evacuating the space between said platen and vacuum blanket to effect firm retention by atmospheric pressure of said substrate in contact with said solar cells and said susceptors in contact with front cell connector strips and said substrate opposite said solar cells during said induction heating of said susceptors in such a way as to bond said solar cells to said substrate, and said connector strips and cell terminals to one another.

3. An assembly fixture for use with an induction heater to fabricate a solar array comprising:

a platen having a normally upper generally planar surface, parallel rows of solar cell locating recesses entering said surface, and connector strip locating channels entering said surface between the adjacent recesses and along the centerlines of said rows and opening endwise to the adjacent recesses, a flexible vacuum blanket adapted to be positioned over said platen with the perimeter of said blanket in sealing contact with said platen and with the normally underside of said blanket facing said platen, metallic susceptors positioned within the bottoms of said recesses, said platen being adapted to receive within said channels front metallic connector strips extending across and contacting the susceptors within said recesses, and to receive within said recesses front side first and over the respective connector strips solar cells having front terminal portions contacting the underlying connector strips, the contacting portions of said cell terminals and connector strips having fusible metal surfaces, and said platen being movable past induction heater means to inductively heat said susceptors and further comprising means for evacuating the space between said platen and vacuum blanket to effect firm retention by atmospheric pressure of said susceptors in contact with said front cell connector strips during said induction heating of said susceptors in such a way as to bond said solar cells to said connector strips.

* * * * *